United States Patent
He et al.

(10) Patent No.: US 11,855,371 B2
(45) Date of Patent: Dec. 26, 2023

(54) CONNECTOR HOUSING ASSEMBLY

(71) Applicant: Tyco Electronics (Shanghai) Co. Ltd., Shanghai (CN)

(72) Inventors: Fei He, Shanghai (CN); Hongqiang (Sean) Han, Shanghai (CN); WenYu (Vindy) Liu, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 154 days.

(21) Appl. No.: 17/411,157

(22) Filed: Aug. 25, 2021

(65) Prior Publication Data

US 2022/0069495 A1  Mar. 3, 2022

(30) Foreign Application Priority Data

Aug. 27, 2020 (CN) .......................... 202021825372.5

(51) Int. Cl.
*H01R 13/46* (2006.01)
*H01R 12/71* (2011.01)

(52) U.S. Cl.
CPC .................................. *H01R 12/716* (2013.01)

(58) Field of Classification Search
CPC . H01R 12/716; G02B 6/4269; H05K 7/20418
See application file for complete search history.

(56) References Cited

U.S. PATENT DOCUMENTS

| | | | | |
|---|---|---|---|---|
| 5,757,998 A * | 5/1998 | Thatcher | ............... | G02B 6/4261 385/75 |
| 6,396,695 B1 * | 5/2002 | Lee | ...................... | H01L 23/4093 257/E23.086 |
| 6,396,696 B1 * | 5/2002 | Lin | ...................... | H01L 23/4093 257/713 |
| 6,434,004 B1 * | 8/2002 | Matteson | ............. | H01L 23/4093 361/720 |
| 6,717,814 B2 * | 4/2004 | Li | ....................... | H01L 23/4093 24/457 |
| 7,625,223 B1 * | 12/2009 | Fogg | ..................... | H05K 5/0247 439/607.3 |
| 7,746,651 B2 * | 6/2010 | Yu | ........................ | H01L 23/4093 165/185 |
| 9,620,890 B1 * | 4/2017 | Vino, IV | ............... | G02B 6/4293 |
| 11,259,444 B2 * | 2/2022 | Liu | ..................... | H05K 7/20418 |
| 11,605,885 B2 * | 3/2023 | Lehman | ................... | H01Q 1/42 |
| 2003/0161108 A1 * | 8/2003 | Bright | .................. | H05K 9/0058 361/707 |
| 2003/0169581 A1 * | 9/2003 | Bright | .................. | H05K 9/0016 361/816 |
| 2003/0171016 A1 * | 9/2003 | Bright | .................. | G02B 6/4261 439/160 |

(Continued)

*Primary Examiner* — Abdullah A Riyami
*Assistant Examiner* — Nelson R. Burgos-Guntin
(74) *Attorney, Agent, or Firm* — Barley Snyder

(57) ABSTRACT

A connector housing assembly includes a housing installed on a circuit board and a heat sink installed on the housing. The heat sink has a front end portion on a top of the housing and a rear end portion extending beyond the housing. A fixing member connected to the housing installs the front end portion of the heat sink on the housing. The connector housing assembly includes a supporting device on the circuit board. The supporting device supports the rear end portion of the heat sink on the circuit board.

20 Claims, 5 Drawing Sheets

(56) References Cited

U.S. PATENT DOCUMENTS

| | | | |
|---|---|---|---|
| 2003/0171033 A1* | 9/2003 | Bright | H05K 9/0058 439/607.25 |
| 2005/0195565 A1* | 9/2005 | Bright | H05K 7/20418 361/688 |
| 2005/0226571 A1* | 10/2005 | Malagrino, Jr. | G02B 6/428 385/92 |
| 2006/0040556 A1* | 2/2006 | Neer | H01R 13/6595 439/607.37 |
| 2007/0082514 A1* | 4/2007 | Ma | H01R 12/7076 439/70 |
| 2008/0106869 A1* | 5/2008 | Li | H01L 23/4093 257/E23.086 |
| 2008/0218976 A1* | 9/2008 | Chen | H01L 23/4006 361/710 |
| 2009/0059536 A1* | 3/2009 | Lai | H01L 23/4093 361/710 |
| 2009/0109627 A1* | 4/2009 | Murr | H05K 7/20418 361/704 |
| 2009/0311885 A1* | 12/2009 | Cheng | H01L 23/4093 361/679.52 |
| 2009/0316367 A1* | 12/2009 | Du | H01L 23/4093 361/720 |
| 2012/0275120 A1* | 11/2012 | Nguyen | G02B 6/4284 361/747 |
| 2013/0034993 A1* | 2/2013 | Szczesny | H01R 13/6587 439/607.17 |
| 2013/0163265 A1* | 6/2013 | Abe | F21S 41/689 362/512 |
| 2014/0153192 A1* | 6/2014 | Neer | G02B 6/4277 361/704 |
| 2014/0154912 A1* | 6/2014 | Hirschy | H05K 9/0058 439/487 |
| 2014/0286613 A1* | 9/2014 | Ito | G02B 6/4292 385/88 |
| 2015/0311635 A1* | 10/2015 | Yeh | G02B 6/4228 439/370 |
| 2016/0212881 A1* | 7/2016 | Saito | H05K 7/20727 |
| 2016/0261030 A1* | 9/2016 | Kim | H01Q 1/1264 |
| 2018/0146576 A1* | 5/2018 | Regnier | H01R 13/6335 |
| 2018/0368283 A1* | 12/2018 | Little | H01R 13/6581 |
| 2019/0045651 A1* | 2/2019 | Ehlen | E05B 65/006 |
| 2019/0103707 A1* | 4/2019 | Tryson | H01R 12/7005 |
| 2019/0230817 A1* | 7/2019 | Han | G02B 6/4269 |
| 2019/0312342 A1* | 10/2019 | Sautter | H01Q 1/3275 |
| 2019/0387644 A1* | 12/2019 | Liu | H05K 7/20436 |
| 2020/0136302 A1* | 4/2020 | Yang | H05K 7/20336 |

* cited by examiner

CONNECTOR HOUSING ASSEMBLY

CROSS-REFERENCE TO RELATED APPLICATION

This application claims the benefit of the filing date under 35 U.S.C. § 119(a)-(d) of Chinese Patent Application No. 202021825372.5, filed on Aug. 27, 2020.

FIELD OF THE INVENTION

The present disclosure relates to a connector and, more particularly, to a connector housing assembly.

BACKGROUND

A connector for an optical module commonly includes a housing (also called an iron cage), a terminal module, a heat sink, and an elastic clip. The terminal module is accommodated in the housing and electrically contacts the inserted optical module. The heat sink is installed on a top opening of the housing, and a lower protrusion of the heat sink protrudes into the housing through the top opening. The elastic clip is buckled onto the housing for pressing and holding the heat sink on the top of the housing. The lower protrusion of the heat sink is in a thermal contact with the optical module when the optical module is inserted into the housing. The elastic clip provides a contact force to ensure that the heat sink is in reliable thermal contact with the housing and the optical module.

In order to further improve the heat dissipation effect, an ultra-long heat sink is used, and the length of the heat sink is several times the length of the housing, which causes most of the heat sink to extend beyond the housing. Therefore, the center of gravity of the heat sink is not located on the housing, but is located outside the housing, which reduces the contact force between the heat sink and the housing as well as the optical module, and reduces the heat dissipation effect of the heat sink.

SUMMARY

A connector housing assembly includes a housing installed on a circuit board and a heat sink installed on the housing. The heat sink has a front end portion on a top of the housing and a rear end portion extending beyond the housing. A fixing member connected to the housing installs the front end portion of the heat sink on the housing. The connector housing assembly includes a supporting device on the circuit board. The supporting device supports the rear end portion of the heat sink on the circuit board.

BRIEF DESCRIPTION OF THE DRAWINGS

The invention will now be described by way of example with reference to the accompanying Figures, of which.

DETAILED DESCRIPTION OF THE EMBODIMENT(S)

In the following, the technical solution of the present disclosure will be further described in detail through the embodiments and in conjunction with the drawings. In the specification, the same or similar reference numbers indicate the same or similar components/elements. The following description of the embodiments of the present disclosure with reference to the accompanying drawings is intended to explain the overall technical concept of the present disclosure, and should not be understood as a limitation to the present disclosure.

In addition, in the following detailed description, for the convenience of explanation, many specific details are set forth to provide a comprehensive understanding of the embodiments of the present disclosure. However, one or more embodiments can also be implemented without these specific details. In other cases, well-known structures and devices are embodied in an illustrative manner to simplify the drawings.

Figure 1:
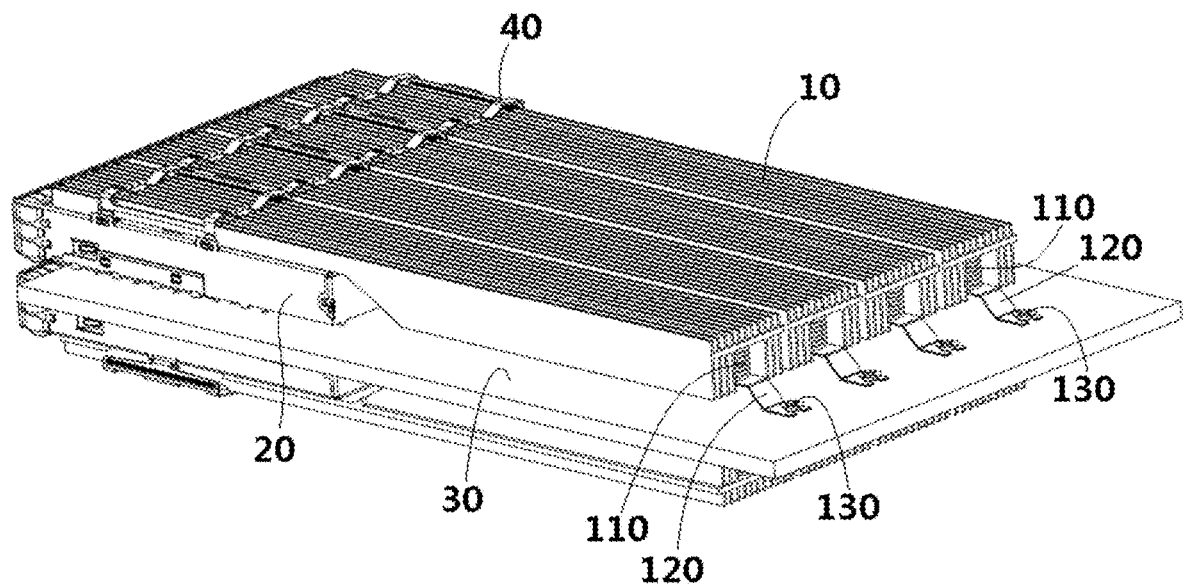
FIG. 1 is a perspective view of a connector housing assembly according to an embodiment.
Figure 2:
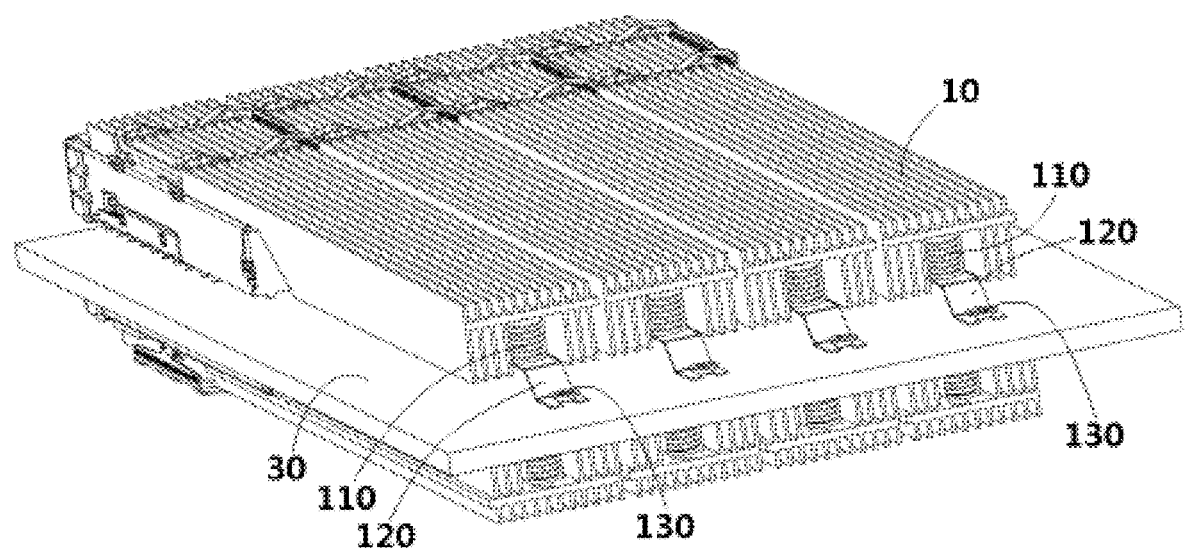
FIG. 2 is another perspective view of the connector housing assembly of FIG. 1.
Figure 3:
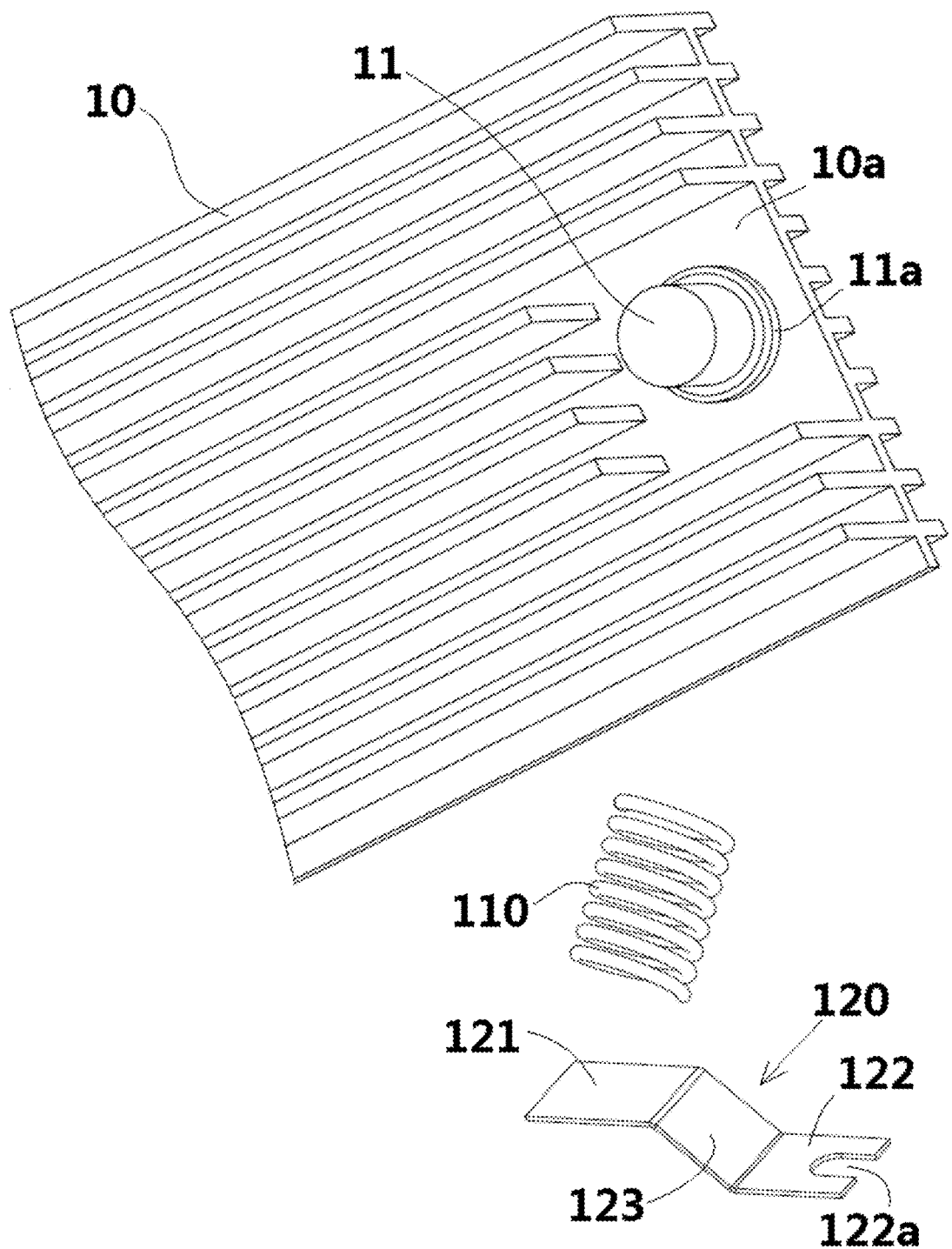
FIG. 3 is an exploded schematic view of a supporting device of the connector housing assembly of FIG. 1.

A connector housing assembly according to a first embodiment, as shown in FIGS. 1 to 3, comprises a housing 20, a heat sink 10, and a fixing member 40 (for example, an elastic clip). The housing 20 is installed on a circuit board 30. The heat sink 10 is installed on the housing 20 and includes a front end portion located on the top of the housing 20 and a rear end portion extending beyond the housing 20. The fixing member 40 is connected to the housing 20 for installing the front end portion of the heat sink 10 on the housing 20. The connector housing assembly further includes a supporting device (which will be described in detail later) provided on the circuit board 30. The rear end portion of the heat sink 10 is supported on the circuit board 30 by the supporting device.

As shown in FIGS. 1 to 3, in the illustrated embodiment, the supporting device includes a spring 110, which is compressed between the rear end portion of the heat sink 10 and the circuit board 30 to elastically support the rear end portion of the heat sink 10.

As shown in FIGS. 1 to 3, in the illustrated embodiment, a supporting member, that is, a positioning post 11 in the shown embodiment, protruding toward the circuit board 30 is formed on the substrate 10*a* of the heat sink 10. The upper end of the spring 110 is sleeved on the positioning post 11.

As shown in FIG. 3, in the illustrated embodiment, an annular positioning flange 11*a* protruding outward in the radial direction is formed at the position of the positioning post 11 connected to the substrate 10*a*. The annular positioning flange 11*a* is in an interference fit with the upper end of the spring 110. However, the present disclosure is not limited to the illustrated embodiment. For example, the upper end of the spring 110 may be directly welded on the substrate 10*a* of the heat sink 10.

As shown in FIGS. 1 to 3, in the illustrated embodiment, the supporting device further includes an arm 120, the arm 120 is fixed onto the circuit board 30, and the lower end of the spring 110 is supported on the arm 120. In an embodiment, the lower end of the spring 110 is directly welded on the arm 120. However, the present disclosure is not limited to the illustrated embodiment. For example, an assembling hole may be formed on the arm 120, and the lower end of the spring 110 can be installed in the assembling hole with an interference fit.

As shown in FIG. 3, in the illustrated embodiment, the arm 120 has a first end portion 121 and a second end portion 122 opposite to each other. The lower end of the spring 110 is supported on the first end portion 121 of the arm 120, the second end portion 122 of the arm 120 is connected and fixed to the circuit board 30 by a screw 130. As shown in FIG. 3, a connecting hole or a C-shaped notch 122a, through which the screw 130 is allowed to pass, is formed on the second end portion 122 of the arm 120. A threaded hole to be matched with the screw 130 is formed on the circuit board 30.

As shown in the embodiment of FIG. 3, the first end portion 121 and the second end portion 122 of the arm 120 are flat end portions parallel to the circuit board 30. The arm 120 further includes an intermediate elastic portion 123 between the first end portion 121 and the second end portion 122, and extending obliquely upward from the second end portion 122.

According to the first embodiment of the present disclosure, the supporting member, that is, the positioning post 11, at the rear end portion of the heat sink 10 can also be implemented in other ways, such as an elastic body, which can directly contact and fit with the circuit board to support the heat sink on the circuit board.

Figure 4:
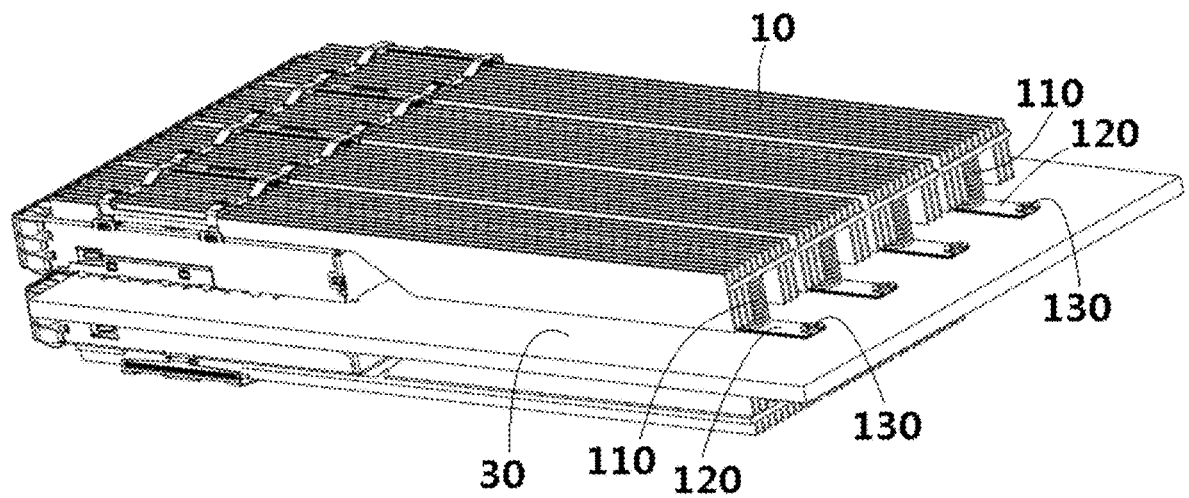
FIG. 4 is a perspective view of a connector housing assembly according to another embodiment.
Figure 5:
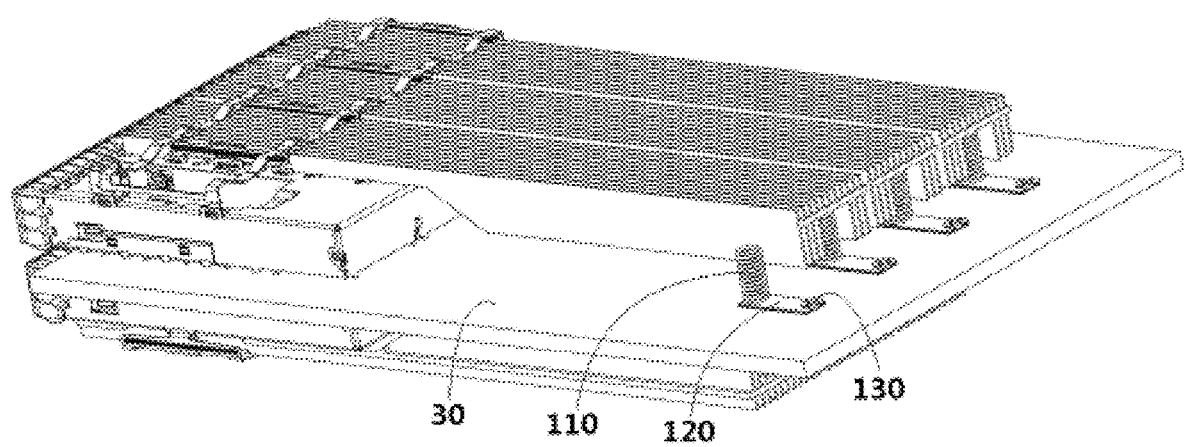
FIG. 5 is a perspective view of the connector housing assembly of FIG. 4 with a heat sink removed.

A connector housing assembly according to a second embodiment is shown in FIGS. 4 and 5. The main difference between the second embodiment shown in FIGS. 4 and 5 and the first embodiment shown in FIGS. 1 to 3 lies in the structure of the arm. As shown in FIGS. 4 and 5, in the illustrated second embodiment, the entire arm 120 is parallel to the circuit board 30 and abuts on the surface of the circuit board 30. Except for the aforementioned difference, the other features of the second embodiment shown in FIGS. 4 and 5 are basically the same as those of the first embodiment shown in FIGS. 1 to 3, and for the sake of brevity, they will not be repeated here.

Figure 6:
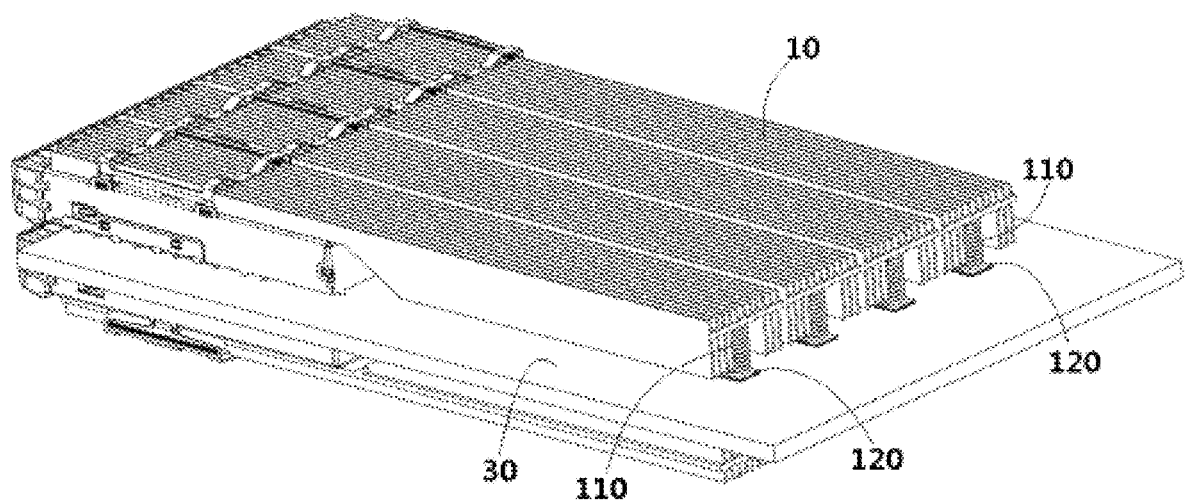
FIG. 6 is a perspective view of a connector housing assembly according to another embodiment.
Figure 7:
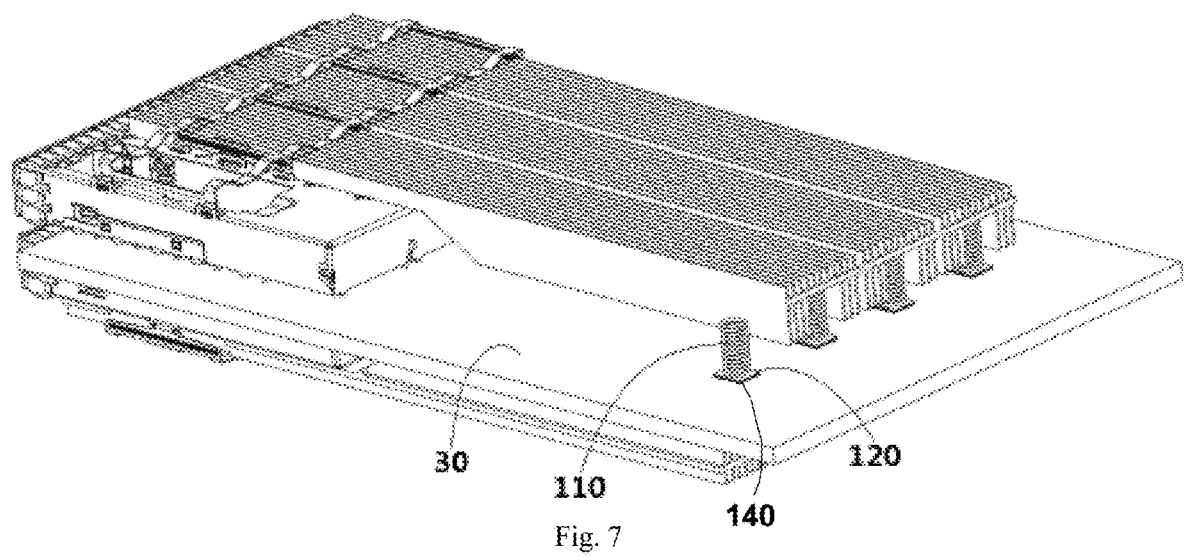
FIG. 7 is a perspective view of the connector housing assembly of FIG. 6 with a heat sink removed.

A connector housing assembly according to a third embodiment is shown in FIGS. 6 and 7. The main difference between the third embodiment shown in FIGS. 6 and 7 and the second embodiment shown in FIGS. 4 and 5 lies in the length of the arm and the way in which the arm is fixed to the circuit board. As shown in FIGS. 6 and 7, in the illustrated third embodiment, the arm 120 is bonded to the surface of the circuit board 30 by an adhesive 140. The length of the arm 120 is slightly larger than an outer diameter of the spring 110. Except for the aforementioned differences, the other features of the third embodiment shown in FIGS. 6 and 7 are basically the same as those of the second embodiment shown in FIGS. 4 and 5, and for the sake of brevity, they will not be repeated here.

Figure 8:
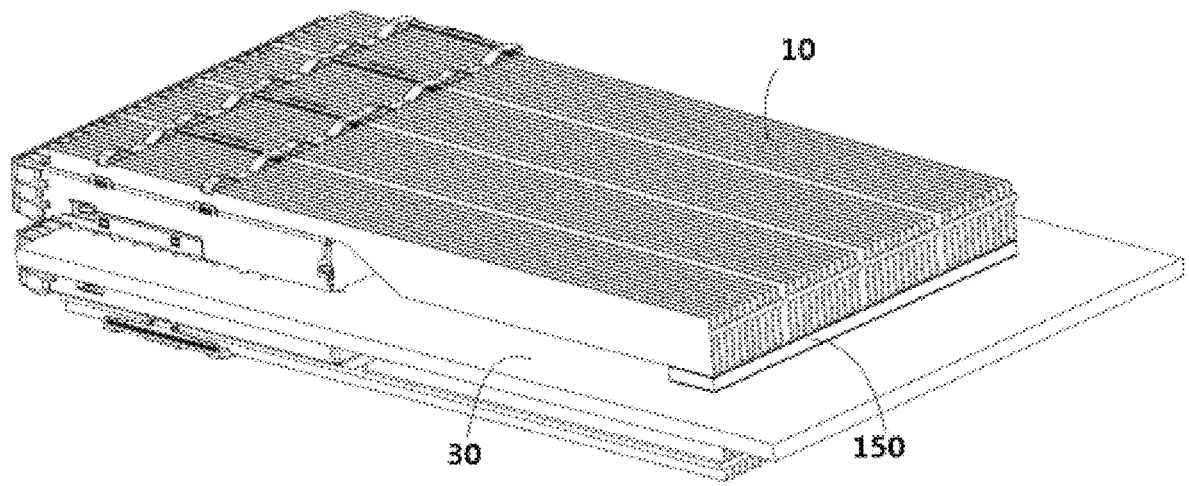
FIG. 8 is a perspective view of a connector housing assembly according to another embodiment.
Figure 9:
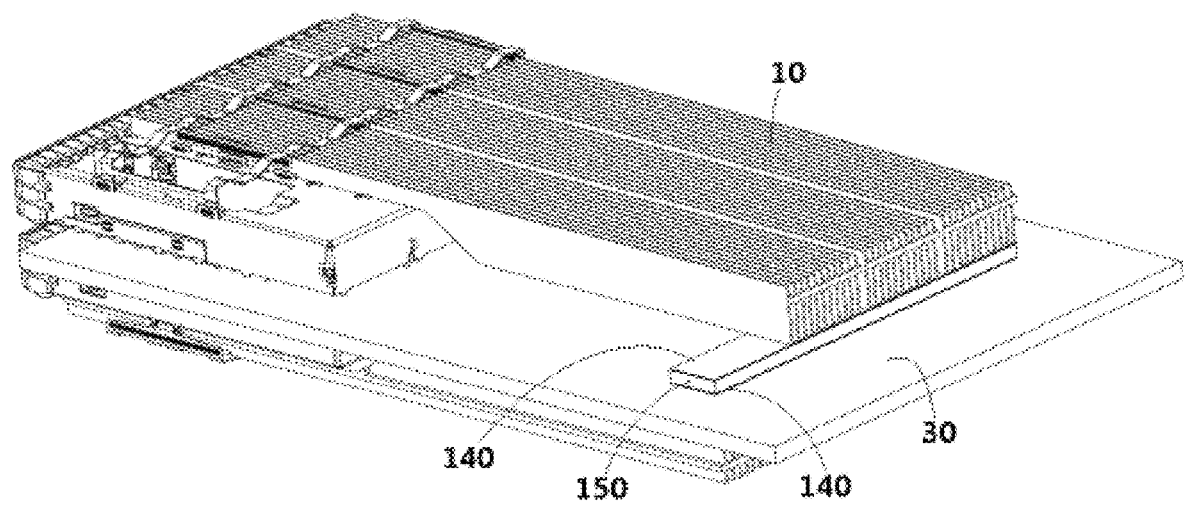
FIG. 9 is a perspective view of the connector housing assembly of FIG. 8 with a heat sink removed.

A connector housing assembly according to a fourth embodiment is shown in FIGS. 8 and 9. As shown in FIGS. 8 and 9, in the illustrated fourth embodiment, the supporting device includes an elastic supporting pad 150, which is compressed between the rear end portion of the heat sink 10 and the circuit board 30 so as to elastically support the rear end portion of the heat sink 10. The elastic supporting pad 150 may be an elastic foam pad, an elastic rubber pad or other suitable elastic material pads.

As shown in FIGS. 8 and 9, in the illustrated fourth embodiment, the surfaces on both sides of the elastic supporting pad 150 are respectively bonded on the heat sink 10 and the circuit board 30 by the adhesive 140.

As shown in FIGS. 8 and 9, in the fourth embodiment shown, the number of heat sinks 10 is multiple, the heat sinks 10 are arranged in a row, the number of elastic supporting pad 150 is single, and the rear end portion of each device 10 is elastically supported on the circuit board 30 through the single elastic supporting pad 150.

Compared with the foregoing first to third embodiments, the structure in the fourth embodiment shown in FIGS. 8 and 9 is simplest.

In the foregoing various exemplary embodiments according to the present disclosure, as the rear end portion of the heat sink 10 that extends beyond the housing 20 is supported on the circuit board 30 by the supporting device, it will not adversely affect the thermal contact performance between the heat sink 10 and the light modules inserted in the housing 20, thereby improving the heat dissipation effect of the heat sink 10.

Those skilled in the art may understand that the embodiments described above are all exemplary, and those skilled in the art may improve them, and the structures described in the various embodiments may be combined freely to the extent that they do not conflict in terms of structure or principle.

Although the present disclosure has been described with reference to the accompanying drawings, the embodiments disclosed in the accompanying drawings are intended to illustrate embodiments of the present disclosure, and should not be understood as a limitation of the present disclosure. Although some embodiments of the general technical concept have been shown and described, those skilled in the art will understand that modifications can be made to these embodiments without departing from the principle and spirit of the general technical concept. The scope of the present disclosure is defined by the claims and their equivalents.

It should be noted that the word "comprise" does not exclude other elements or steps, and the word "a" or "an" does not exclude a plurality. In addition, any reference numbers in the claims should not be construed as limiting the scope of the present disclosure.

What is claimed is:

1. A connector housing assembly, comprising:
   a housing installed on a circuit board;
   a heat sink installed on the housing, the heat sink having a front end portion on a top of the housing and a rear end portion extending beyond the housing;
   a fixing member connected to the housing and installing the front end portion of the heat sink on the housing; and
   a supporting device on the circuit board, the supporting device supports the rear end portion of the heat sink on the circuit board, the supporting device has a spring compressed between the rear end portion of the heat sink and the circuit board.

2. The connector housing assembly of claim 1, wherein the spring elastically supports the rear end portion of the heat sink.

3. The connector housing assembly of claim 1, wherein the heat sink has a substrate, the substrate has a positioning post protruding toward the circuit board.

4. The connector housing assembly of claim 3, wherein an end of the spring is sleeved on the positioning post.

5. The connector housing assembly of claim 4, wherein the end of the spring is welded on the substrate.

6. The connector housing assembly of claim 3, wherein an annular positioning flange protruding outward in a radial direction is formed at a connection of the positioning post and the substrate.

7. The connector housing assembly of claim 6, wherein the annular positioning flange is in an interference fit with an end of the spring.

8. The connector housing assembly of claim 1, wherein the supporting device has an arm fixed on the circuit board, an end of the spring is supported on the arm.

9. The connector housing assembly of claim 8, wherein the end of the spring is welded on the arm.

10. The connector housing assembly of claim 8, wherein the arm has an assembling hole, the end of the spring is interference fit in the assembling hole.

11. The connector housing assembly of claim 8, wherein the arm has a first end portion and a second end portion opposite to the first end portion, the end of the spring is supported on the first end portion of the arm and the second end portion of the arm is connected and fixed to the circuit board.

12. The connector housing assembly of claim 11, wherein the second end portion of the arm has a connecting hole or a C-shape notch receiving a screw, a threaded hole corresponding with the screw is formed on the circuit board.

13. The connector housing assembly of claim 11, wherein the first end portion of the arm and the second end portion of the arm are each a flat end portion parallel to the circuit board, the arm has an intermediate elastic portion between the first end portion and the second end portion extending obliquely upward from the second end portion.

14. The connector housing assembly of claim 11, wherein an entirety of the arm is parallel to the circuit board and abuts on a surface of the circuit board.

15. The connector housing assembly of claim 8, wherein the arm is bonded on a surface of the circuit board by an adhesive.

16. The connector housing assembly of claim 1, wherein the supporting device has an elastic supporting pad compressed between the rear end portion of the heat sink and the circuit board, the elastic supporting pad elastically supporting the rear end portion of the heat sink.

17. The connector housing assembly of claim 16, wherein a pair of opposite sides of the elastic supporting pad are respectively bonded on the heat sink and the circuit board by an adhesive.

18. The connector housing assembly of claim 16, wherein the heat sink is one of a plurality of heat sinks arranged in a row and the rear end portion of each of the heat sinks is elastically supported on the circuit board by the elastic supporting pad formed as a single pad.

19. A connector housing assembly, comprising:
a housing installed on a circuit board;
a heat sink installed on the housing, the heat sink having a front end portion on a top of the housing and a rear end portion extending beyond the housing, the rear end portion of the heat sink has a supporting member fitting with the circuit board or fitting with a supporting device on the circuit board to support the heat sink, the supporting member or the supporting device has a spring compressed between the rear end portion of the heat sink and the circuit board; and
a fixing member connected to the housing and installing the front end portion of the heat sink on the housing.

20. A connector housing assembly, comprising:
a housing installed on a circuit board;
a heat sink installed on the housing, the heat sink having a front end portion on a top of the housing and a rear end portion extending beyond the housing;
a fixing member connected to the housing and installing the front end portion of the heat sink on the housing; and
a supporting device on the circuit board, the supporting device supports the rear end portion of the heat sink on the circuit board, the supporting device has an elastic supporting pad compressed between the rear end portion of the heat sink and the circuit board, the elastic supporting pad elastically supporting the rear end portion of the heat sink, a pair of opposite sides of the elastic supporting pad are respectively bonded on the heat sink and the circuit board by an adhesive.

* * * * *